(12) United States Patent
Nakajima et al.

(10) Patent No.: US 9,422,624 B2
(45) Date of Patent: Aug. 23, 2016

(54) HEAT TREATMENT METHOD

(71) Applicant: TOKYO ELECTRON LIMITED, Tokyo (JP)

(72) Inventors: Shigeru Nakajima, Nirasaki (JP); Hiromi Shima, Nirasaki (JP); Yusuke Tachino, Nirasaki (JP)

(73) Assignee: TOKYO ELECTRON LIMITED, Tokyo (JP)

(*) Notice: Subject to any disclaimer, the term of this patent is extended or adjusted under 35 U.S.C. 154(b) by 0 days.

(21) Appl. No.: 14/603,405

(22) Filed: Jan. 23, 2015

(65) Prior Publication Data

US 2015/0211113 A1    Jul. 30, 2015

(30) Foreign Application Priority Data

Jan. 24, 2014    (JP) ................. 2014-011428

(51) Int. Cl.
*C23C 16/448* (2006.01)
*C23C 16/44* (2006.01)
*C23C 16/455* (2006.01)

(52) U.S. Cl.
CPC ....... *C23C 16/4402* (2013.01); *C23C 16/45546* (2013.01); *C23C 16/45572* (2013.01); *C23C 16/45578* (2013.01)

(58) Field of Classification Search
CPC  C23C 16/448; C23C 16/45563; C23C 16/46; C23C 16/56
See application file for complete search history.

(56) References Cited

U.S. PATENT DOCUMENTS

| | | | | |
|---|---|---|---|---|
| 4,836,774 A | * | 6/1989 | Harada ............... | C21D 9/63 432/59 |
| 2002/0187728 A1 | * | 12/2002 | Kiuchi ............. | B24B 37/015 451/5 |
| 2003/0173347 A1 | * | 9/2003 | Guiver ............ | H01L 21/67017 219/390 |
| 2005/0164445 A1 | * | 7/2005 | Lin .................. | H01L 29/513 438/240 |
| 2005/0183518 A1 | * | 8/2005 | Neuefeind ....... | G01N 23/20025 73/863.11 |
| 2011/0117729 A1 | * | 5/2011 | Osborne ............ | C23C 16/24 438/478 |

FOREIGN PATENT DOCUMENTS

| | | |
|---|---|---|
| JP | 2002-176020 A | 6/2002 |
| JP | 2002-261028 A | 9/2002 |
| JP | 2004-006898 A | 1/2004 |
| JP | 3952341 B2 | 5/2007 |
| JP | 2008-508744 A | 3/2008 |
| JP | 2008-538256 A | 10/2008 |
| JP | 2011-195346 A | 10/2011 |

OTHER PUBLICATIONS

Kim, Soon Kyung, et al., "A Study on the Annealing Characteristics of BAF for Cold Rolled Steel Strip". KSME International Journal, vol. 12, No. 2, pp. 330-337, 1998.*

* cited by examiner

*Primary Examiner* — Bret Chen
(74) *Attorney, Agent, or Firm* — Nath, Goldberg & Meyer; Jerald L. Meyer

(57) ABSTRACT

The present disclosure provides a heat treatment method, in which a substrate supporter supporting a plurality of substrates in the configuration of a shelf thereon is loaded in a vertical reaction tube surrounded by a heating mechanism and a heat treatment is performed. The method includes discharging a processing gas from a gas nozzle provided in the reaction tube to extend in a vertical direction of the substrate supporter, and supplying a temperature adjusting fluid into a flow path forming member provided to surround the gas nozzle in the reaction tube and adjusting a temperature of the processing gas in the gas nozzle.

11 Claims, 14 Drawing Sheets

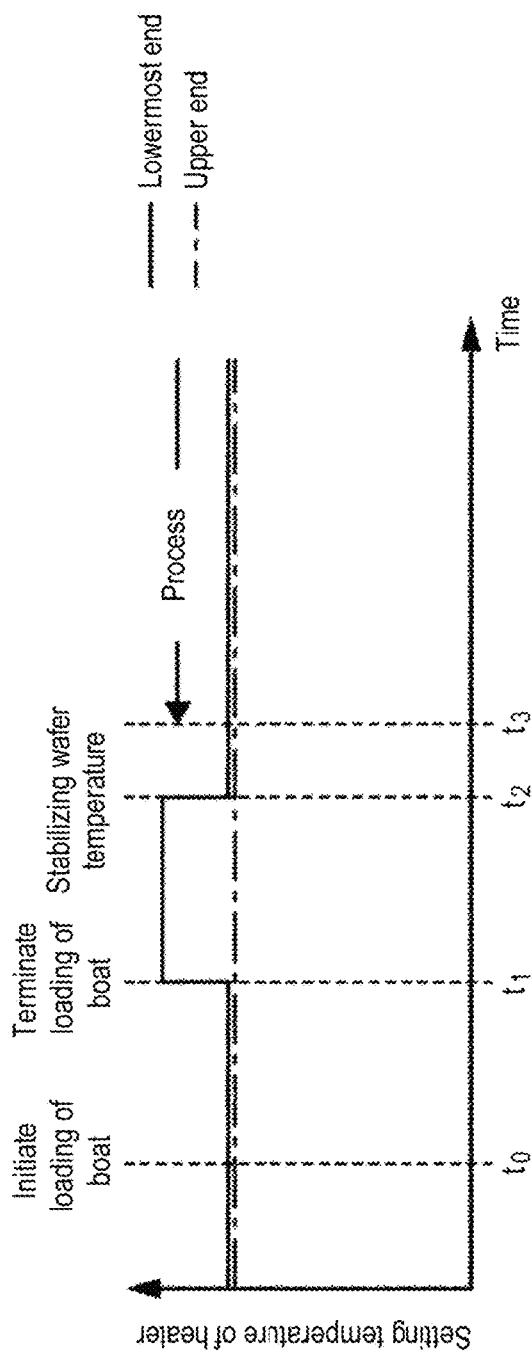

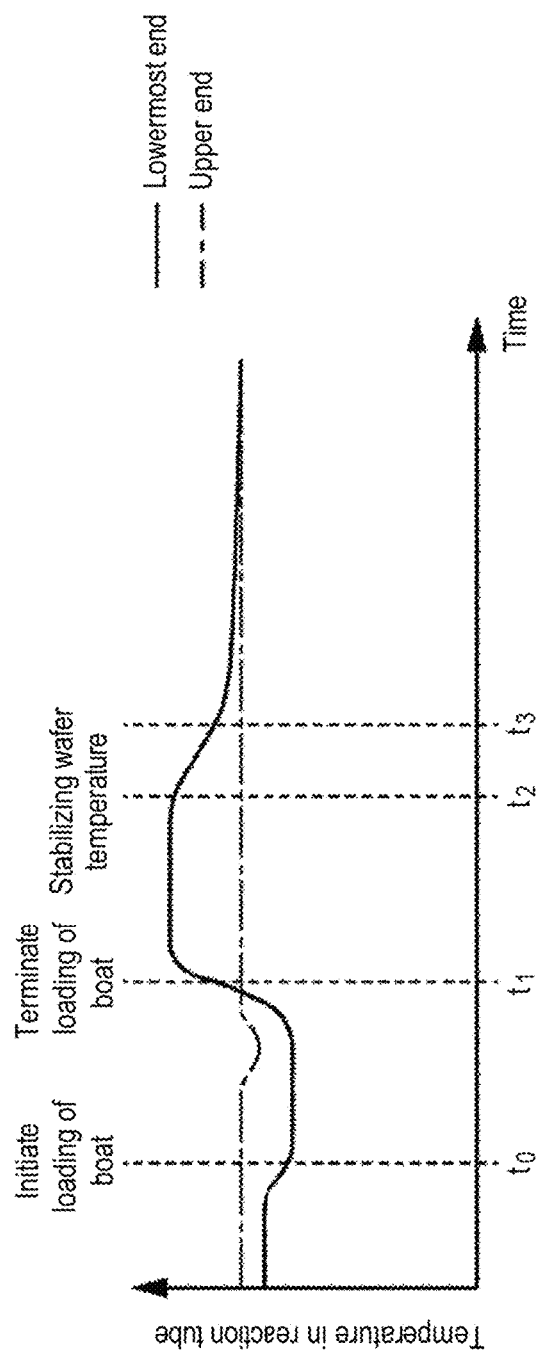

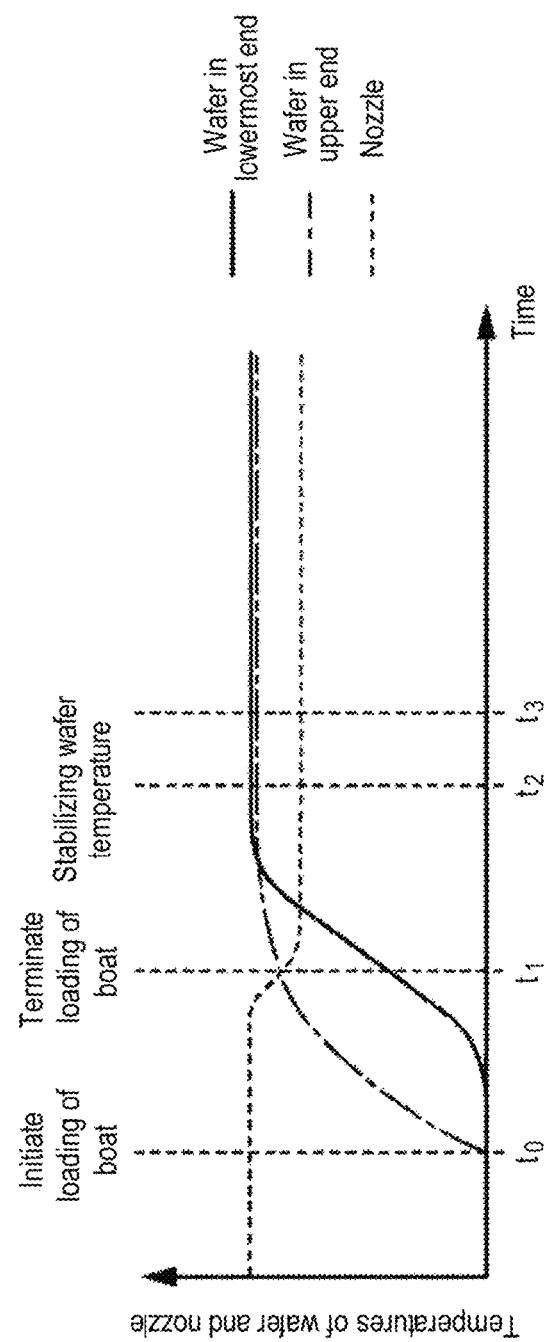

HEAT TREATMENT METHOD

CROSS-REFERENCE TO RELATED APPLICATION

This application claims priority to and the benefit of Japanese Patent Application No. 2014-011428, filed on Jan. 24, 2014, in the Japan Patent Office, the disclosure of which is incorporated herein in its entirety by reference.

TECHNICAL FIELD

The present disclosure relates to a vertical heat treatment apparatus, a heat treatment method and a storage medium, in which a heat treatment is performed by supplying a processing gas from a gas nozzle to substrates mounted in the configuration of a shelf onto a substrate supporter in a vertical reaction tube.

BACKGROUND

For an apparatus that performs a heat treatment such as a thin film forming process on a plurality of substrates such as semiconductor wafers (hereinafter, referred to as "wafers") in a stack there is known a vertical heat treatment apparatus in which a wafer boat (substrate supporter) having wafers mounted in the configuration of a shelf is air-tightly loaded in a vertical reaction tube from below and a heat treatment is performed on the wafers. In the reaction tube, gas nozzles supplying processing gases for generating a heat treatment atmosphere are disposed along the vertical direction of the wafer boat. In addition, heaters constituting a heating mechanism for heating the wafers are provided outside the reaction tube. The heaters are separated and provided in a plurality of, for example, five zones in the vertical direction, which are configured such that the temperatures of the respective zones may be independently adjusted.

In such an apparatus, when the heat treatment on the wafers is terminated, the processed wafers are replaced with unprocessed wafers in the wafer boat from below the reaction tube in a state in which the heaters are continuously energized (the interior of the reaction tube is continuously heated). Then, the wafer boat is raised and a heat treatment is performed on the unprocessed wafers. Here, when the wafer boat is loaded into the reaction tube, the temperature of a lower region in the reaction tube is more easily reduced than the temperature of an upper region therein. Therefore, in order to uniformize the heating temperature between the wafers when the wafer boat is loaded into the reaction tube, the heater in the lowermost zone (or the second lowermost zone and the lowermost zone), from among the above-described five zones, is more strongly energized than the other heaters.

As an example of the above-described film forming process, there is an ALD (Atomic Layer Deposition) method in which a thin film is formed by alternately supplying the processing gases that react with each other and stacking a reaction product of these processing gases. When a high dielectric constant film such as hafnium oxide (Hf—O) is formed as the thin film, the processing gases include, for example, TDMAH (tetrakis dimethyl amino hafnium) gas as a source gas and ozone ($O_3$) gas as a reaction gas. Further, in addition to the hafnium oxide film, the high dielectric constant film includes a zirconium oxide (Zr—O) film, a titanium oxide (Ti—O) film, an aluminum oxide (Al—O) film, and the like. The high dielectric constant film is formed using metal-containing carbide (organic material)-based gas as the source gas. The source gas and the reaction gas are respectively supplied from different gas nozzles. In addition, when the high dielectric constant film is formed, in order to possibly reduce a level of contamination remaining in the high dielectric constant film, the heating temperature of the wafers is set near the thermal decomposition temperature of the source gas.

However, if the already-described zone control is performed when such a high dielectric constant film is formed, there is a concern that the internal temperature of the gas nozzle for supplying the source gas exceeds the thermal decomposition temperature of the source gas. That is, in the case where the heating temperature of the wafers in the reaction tube is set near the thermal decomposition temperature of the source gas, if the temperature of the lowermost zone is set higher than the temperature of the other zones, the internal temperature of the gas nozzle positioned in the lowermost zone easily reaches a temperature exceeding the thermal decomposition temperature of the source gas. Furthermore, if the internal temperature of the gas nozzle exceeds the thermal decomposition temperature of the source gas, accretion occurs easily in the interior of the gas nozzle. Thus, in order to restrain particles or nozzle clogging caused by exfoliation of the accretion, the gas nozzle should be frequently replaced. As a method of restraining the accretion from occurring, there is a method in which a gas such as nitrogen ($N_2$) gas is allowed to flow into the gas nozzle after the source gas is supplied. However, this does not result in much of an improvement.

In the related art, there is known a technique of forming a thin film using a CVD (Chemical Vapor Deposition) method, in which nitrogen gas is discharged from a surface of an injector in order to restrain the reaction between tin tetrachloride and water vapor at the surface of the injector. In addition, there are other techniques known for cooling an injector head or an injector in a single substrate type apparatus. However, the aforementioned techniques have not considered the concern of a temperature distribution of a processing gas in a vertical heat treatment apparatus.

SUMMARY

Various embodiments of the present disclosure provide a technique of uniformizing a temperature of a processing gas along the length direction of a gas nozzle when a heat treatment is performed by supplying the processing gas from the gas nozzle to the substrates supported in the configuration of a shelf on a substrate supporter in a vertical reaction tube.

According to one embodiment of the present disclosure, there is provided a vertical heat treatment apparatus, in which a substrate supporter supporting a plurality of substrates in the configuration of a shelf thereon is loaded in a vertical reaction tube surrounded by a heating mechanism and a heat treatment is performed, the apparatus including: a gas nozzle provided in the reaction tube to extend in a vertical direction of the substrate supporter and configured to discharge a processing gas; and a flow path forming member provided to surround the gas nozzle in the reaction tube, wherein the flow path forming member defines a fluid flowing space of a temperature adjusting fluid for adjusting a temperature of the processing gas in the gas nozzle and has a supply hole and an exhaust hole for supplying and discharging the temperature adjusting fluid.

According to another embodiment of the present disclosure, there is provided a heat treatment method, in which a substrate supporter supporting a plurality of substrates in the configuration of a shelf thereon is loaded in a vertical reaction tube surrounded by a heating mechanism and a heat treatment is performed, the heat treatment method including: discharging a processing gas from a gas nozzle provided in the reaction tube to extend in a vertical direction of the substrate supporter; and supplying a temperature adjusting fluid into a flow path forming member provided to surround the gas nozzle in the reaction tube and adjusting a temperature of the processing gas in the gas nozzle.

According to still another embodiment of the present disclosure, there is provided a non-transitory storage medium configured to store a computer program operating on a computer, wherein the computer program includes a group of steps for performing the heat treatment method according to the another embodiment of the present disclosure.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

FIGS. 7A to 7D are graphs in which the setting temperatures of respective heaters or heating temperatures of wafers in a film forming process are arranged in serial time.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

An embodiment of a vertical heat treatment apparatus according to the present disclosure will be described with reference to FIGS. 1 to 6. First, the vertical heat treatment apparatus will be generally described in brief. The vertical heat treatment apparatus is a film forming apparatus configured to form a thin film by an ALD method in which a source gas and a reaction gas (oxidizing gas) reacting with each other are alternately supplied to wafers W and a reaction product thereof is stacked. Further, the present disclosure is characterized by a configuration of a gas nozzle for supplying the source gas and a film forming method using the aforementioned configuration. The film forming apparatus will be described in detail below.

Figure 1:
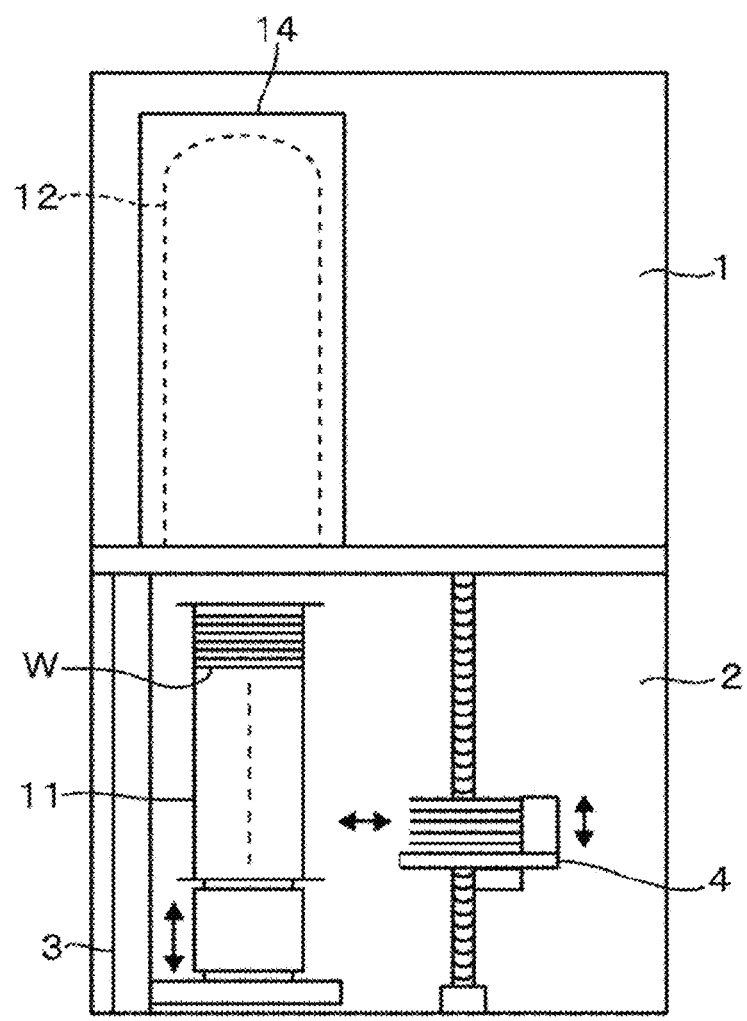
FIG. 1 is a schematic view showing an example of a vertical heat treatment apparatus of the present disclosure.

As shown in FIG. 1, the film forming apparatus is provided with a heat treatment region 1 in which a reaction tube 12 configured to perform a film forming process on a plurality of, for example, 150 sheets of wafers W in a stack is disposed. In addition, the film forming apparatus is provided with a loading/unloading region 2 of the wafers W which is defined under the heat treatment region 1. The film forming apparatus is also provided with a wafer boat 11, which is a substrate supporter to mount the wafers W in the configuration of a shelf thereon. The wafer boat 11 may be moved up and down between the heat treatment region 1 and the loading/unloading region 2. In FIG. 1, the film forming apparatus includes a boat elevator 3, and an arm 4 configured to transfer and mount the wafers W to the wafer boat 11. An elevating speed of the wafer boat 11 by the boat elevator 3 is, for example, 400 mm/min to 600 mm/min. In addition, although not shown here, a lid configured to close a lower opening of the reaction tube 12 when the wafer boat 11 is taken out of the reaction tube 12 is provided and configured to be horizontally slidable between the heat treatment region 1 and the loading/unloading region 2.

Figure 2:
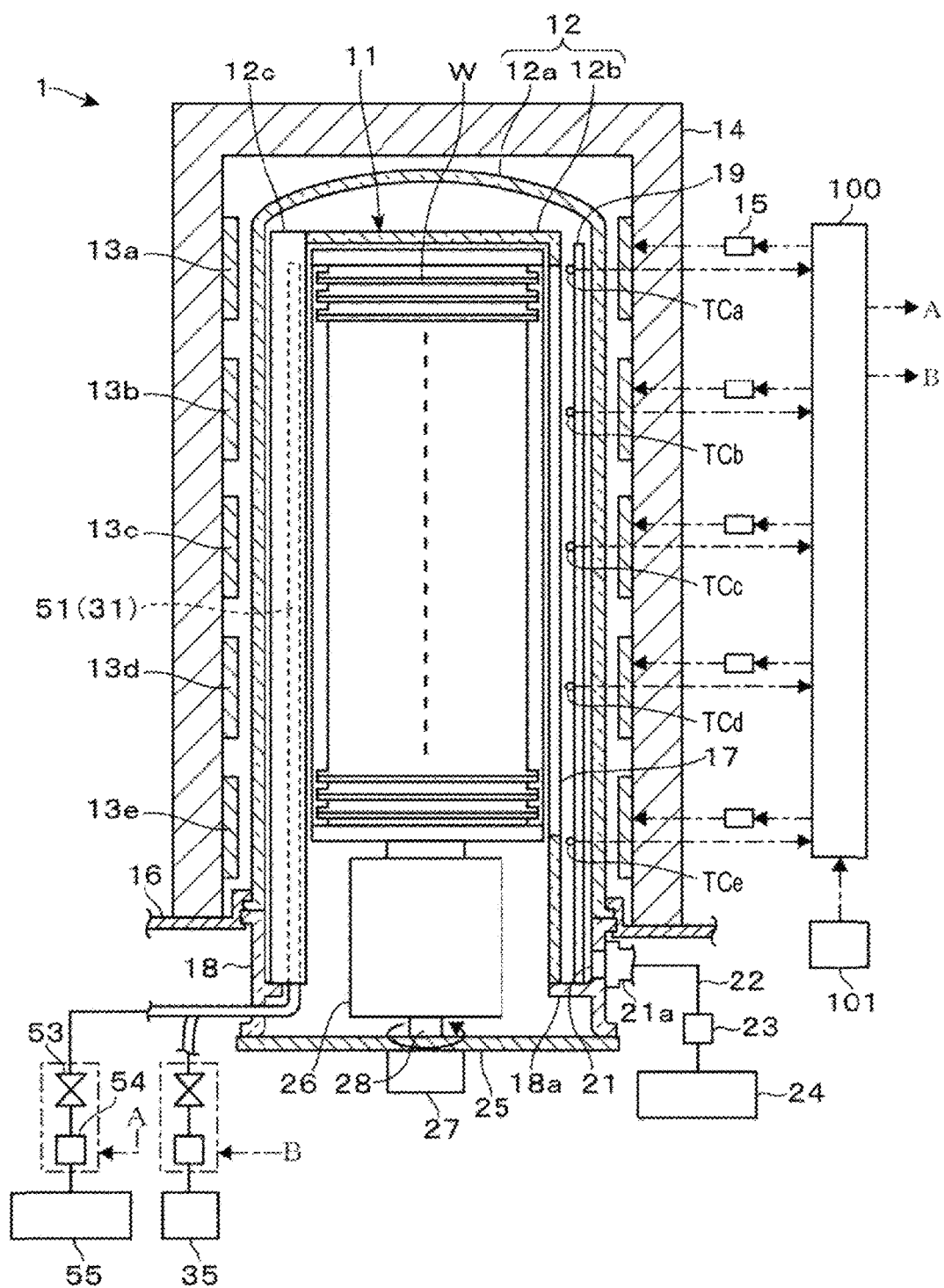
FIG. 2 is a longitudinal sectional view showing the vertical heat treatment apparatus of FIG. 1.

As shown in FIG. 2, the heat treatment region 1 is provided with a generally cylindrical heating furnace main body 14 having an open bottom. The reaction tube 12, in which the wafer boat 11 is air-tightly accommodated and a film forming process is performed, is disposed inside the heating furnace main body 14. Heaters 13, operable as a heating mechanism, are disposed on an inner wall surface of the heating furnace main body 14 in the circumferential direction. The heaters 13 are provided to surround an accommodation region of the wafers W on the wafer boat and arranged to be spaced apart from each other at a plurality of, for example, five zones in upward and downward directions.

The five heaters (heating units) 13 are assigned reference numerals "13a," "13b," "13c," "13d," and "13e" in this order from top to bottom, as shown in FIG. 2. The respective heaters 13a to 13e are individually connected to a power supply 15. Then, the heaters 13a to 13e are configured such that they can individually adjust the heating temperatures of the respective zones in the reaction tube 12 that the heaters 13a to 13e serve, respectively. As described later, when the film forming process on the wafers W is initiated, the power of the two lower heaters 13d and 13e is set higher than that of the other heaters 13a to 13c. In addition, although this embodiment has five vertically arranged heaters 13a to 13e, there may be provided four heaters 13a to 13d or three heaters 13a to 13c. That is, in the present embodiment, when the film forming process is initiated, the power of the lower zones of the plurality of vertically arranged heaters 13 is set higher than that of the other heaters 13.

Figure 3:
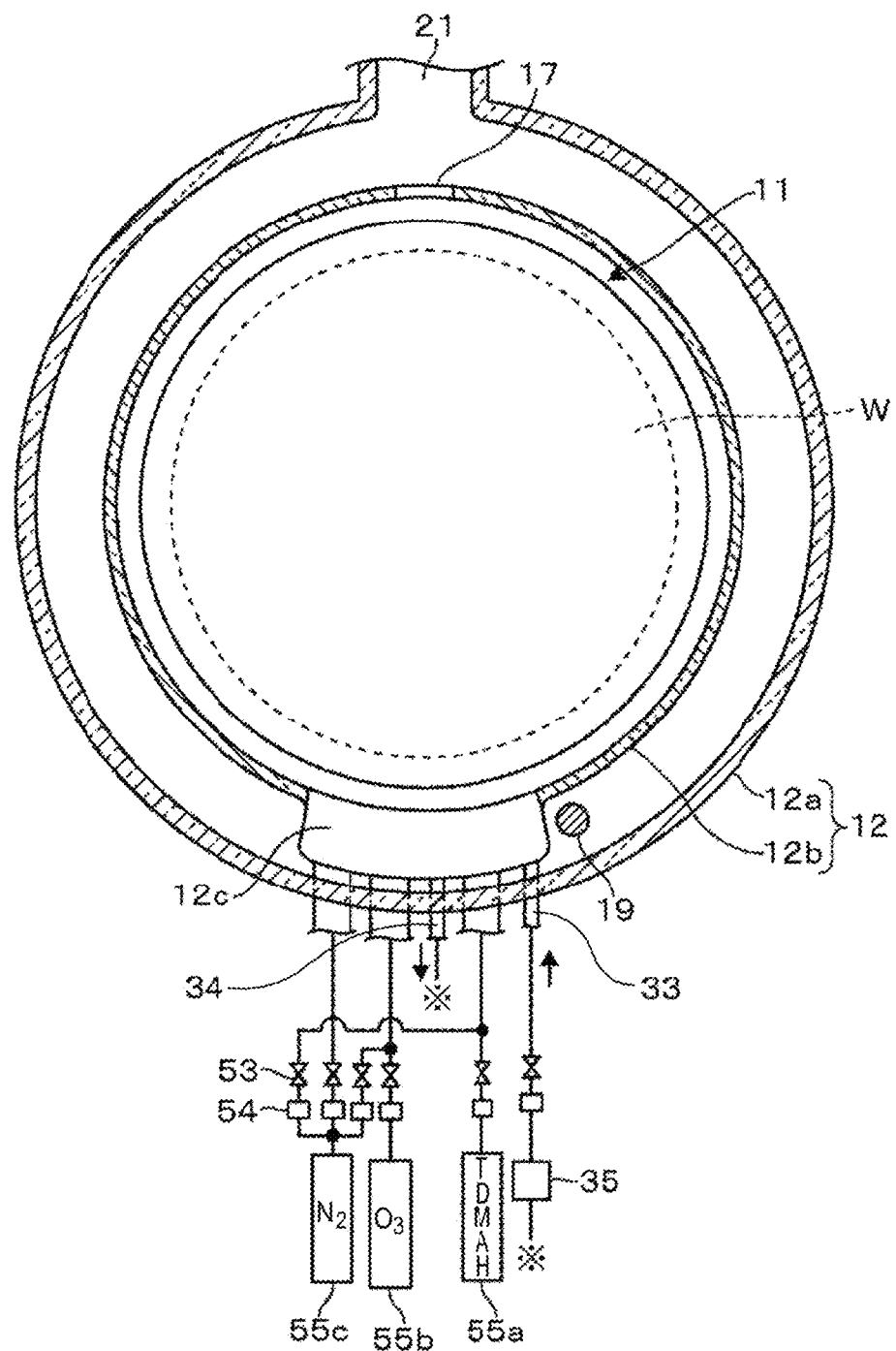
FIG. 3 is a transverse sectional view showing the vertical heat treatment apparatus of FIG. 1.
Figure 4:
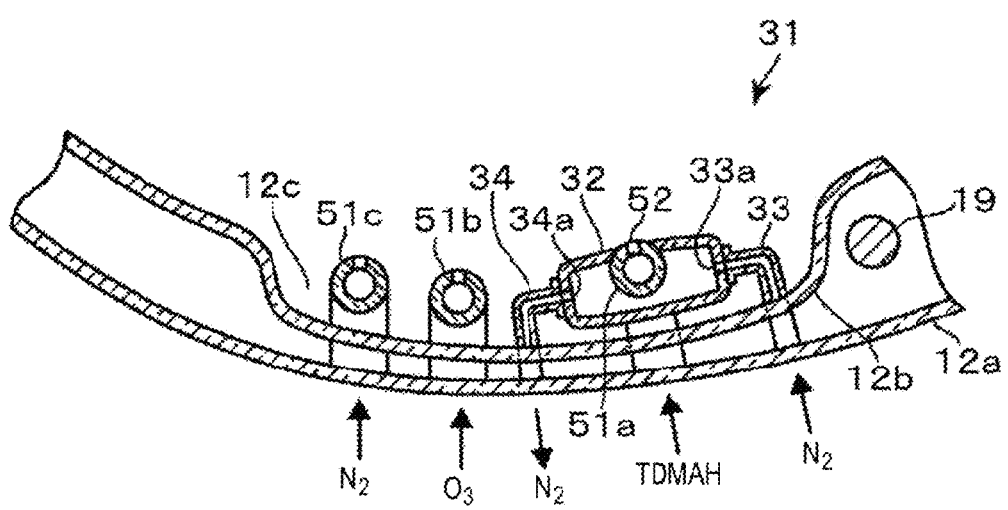
FIG. 4 is an enlarged transverse sectional view showing a portion of the vertical heat treatment apparatus of FIG. 1.

As shown in FIGS. 2 and 3, the reaction tube 12 is made of quartz and, in this example, has a double-tube structure consisting of an outer tube 12a and an inner tube 12b accommodated inside the outer tube 12a. Each of the outer tube 12a and the inner tube 12b is formed to have an open bottom. As also shown in FIGS. 3 and 4, a portion of one end side (front side) of the inner tube 12b in a plan view is formed to bulge toward the outer tube 12a over a circumferential direction of the inner tube 12b. In addition, the portion of one end side (front side) of the inner tube 12b forms a region 12c configured to accommodate gas nozzles (gas injectors) 51a to 51c and a flow path forming member 31, which will be described later. As also shown in FIG. 2, a portion of the inner tube 12b opposite to this region 12c is open over the circumferential direction of the inner tube 12b to form a slit 17 that is an exhaust opening. Further, for convenience of illustration, the previously-described region 12c is shown in FIGS. 2 and 3 and an internal structure of the region 12c is shown in FIG. 4.

The outer tube 12a and the inner tube 12b are air-tightly supported at the bottoms thereof by a generally circular cylinder-shaped flange part 18 having open upper and lower sides. That is, the lower end of the outer tube 12a is air-tightly supported by the upper end side of the flange part 18. In addition, the lower end of the inner tube 12b is air-tightly supported by a protrusion 18a, which horizontally protrudes inward from the inner wall surface of the flange part 18 along the circumferential direction. As shown in FIG. 2, a vertically extending rod 19 is provided with the flange part 18 between the outer tube 12a and the inner tube 12b. The rod 19 is provided with temperature sensors TCa to TCe consisting of thermocouples to measure the temperature at vertical positions corresponding to the previously-described heaters 13a to 13e, respectively.

These temperature sensors TCa to TCe are configured such that the temperatures measured in the zones in which the heaters 13a to 13e serve are transmitted to a later-described control unit 100 through conductive paths wired within the rod 19, respectively. In FIG. 2, reference numeral 16 designates a base plate for supporting the flange part 18 and the previously-described heating furnace main body 14. In addition, the rod 19 is disposed, for example, adjacent to the previously-described region 12c, as shown in FIG. 3. However, the rod 19 is shown in FIG. 2 to be laterally spaced in order to show respective positional relationships between the heaters 13a to 13e and the temperature sensors TCa to TCe.

As shown in FIG. 2, an exhaust opening 21 is formed in a portion of the sidewall of the flange part 18 opposite to the previously-described slit 17, so as to be in communication with a region between the inner tube 12b and the outer tube 12a. In addition, as shown in FIG. 2, an exhaust path 22 extending from the exhaust opening 21 is connected to a vacuum pump 24 through a pressure adjustment part 23 such as a butterfly valve. A lid 25, which is formed in the shape of a generally circular disc to be in air-tight contact with a circumferential flange surface that is an outer peripheral portion of the lower end of the flange part 18, is provided under the flange part 18. The lid 25 is configurable to be elevated along with the wafer boat 11 by the boat elevator 3. In FIG. 2, the heat treatment region 1 also includes a thermal insulator 26 and a rotary mechanism 27 such as a motor. The heat treatment region 1 in FIG. 2 further includes a rotary shaft 28 and an exhaust port 21a.

The gas nozzles 51 for supplying the processing gases into the reaction tube 12 will be described next in more detail. As shown in FIG. 4, the three gas nozzles 51, each of which is made of quartz, are disposed. The gas nozzles 51 are respectively arranged along the vertical direction of the wafer boat 11 and spaced apart from each other in the circumferential direction of the reaction tube 12. As shown in FIG. 4, the three gas nozzles 51 are configured, in some embodiments, as a source gas nozzle 51a, an ozone gas nozzle 51b and a purge gas nozzle 51c disposed in a clockwise direction (in the right circumferential direction), as viewed from the top of the reaction tube 12.

These gas nozzles (gas supply units) 51a to 51c are connected to a reservoir 55a of the source gas (TDMAH gas), a reservoir 55b of the reaction gas (ozone ($O_3$) gas), and a reservoir 55c of a purge gas (nitrogen ($N_2$) gas), respectively. A plurality of gas discharge holes 52 are formed on a lateral surface of the slit 17 of each of the gas nozzles 51a to 51c along the vertical direction of the wafer boat 11.

Referring back to FIG. 3, reference numeral 53 designates valves, and reference numeral 54 designates flow rate adjusters. The valves 53 and the flow rate adjusters 54 are configured such that nitrogen gas can be supplied not only to the purge gas nozzle 51c but also to other gas nozzles 51a and 51b. The reservoir 55a stores a liquid that is a raw material of a high dielectric constant film. In addition, although not shown here, the reservoir 55a is configured to supply the metal-containing organic gas vaporized by heating the liquid, together with nitrogen gas or the like as a carrier gas.

Figure 5:
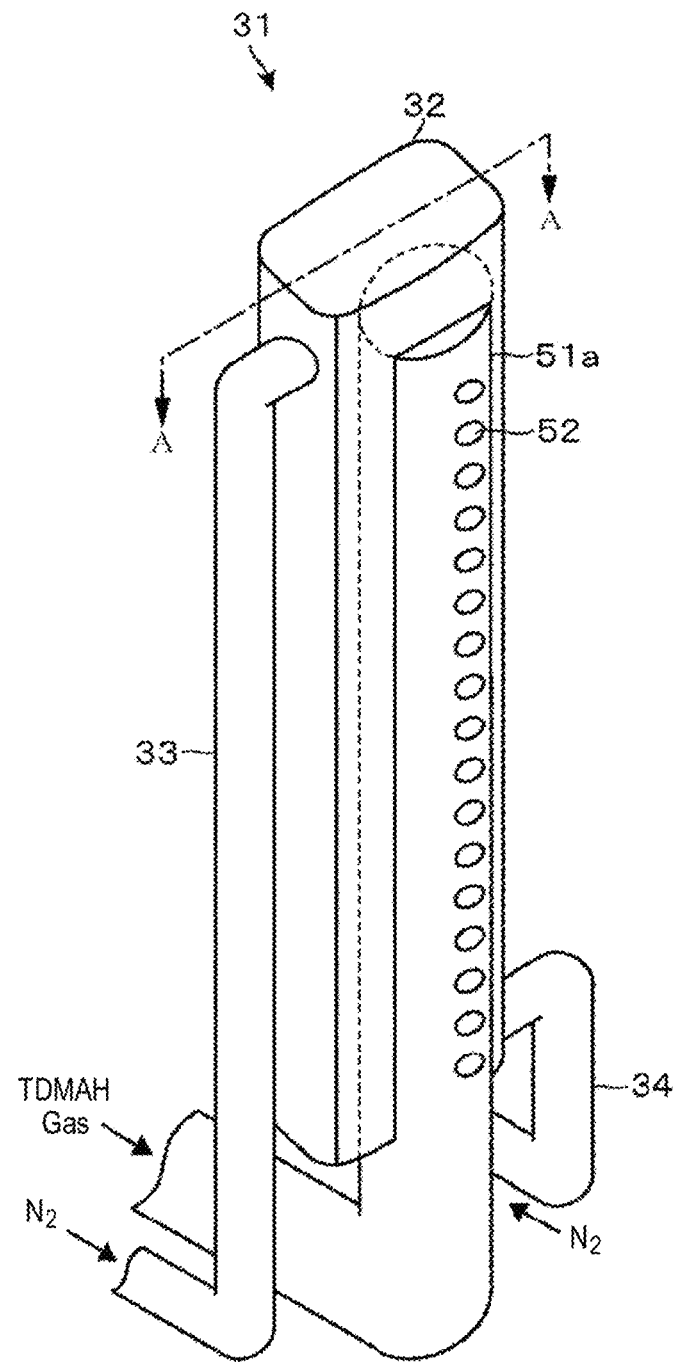
FIG. 5 is a perspective view showing an example of a gas nozzle provided in the vertical heat treatment apparatus, according to some embodiments.

In addition, the flow path forming member 31 for adjusting a temperature of the source gas nozzle 51a is provided around the source gas nozzle 51a. The flow path forming member 31 is made of quartz and welded to the source gas nozzle 51a to generally surround the source gas nozzle 51a. That is, as shown in FIG. 5, the flow path forming member 31 includes a generally box-shaped flow path main body 32 extending along the length direction of the source gas nozzle 51a, and a supply path 33 and an exhaust path 34 respectively extending from a lateral surface in the vicinity of the upper and lower ends of the flow path main body 32.

Figure 6:
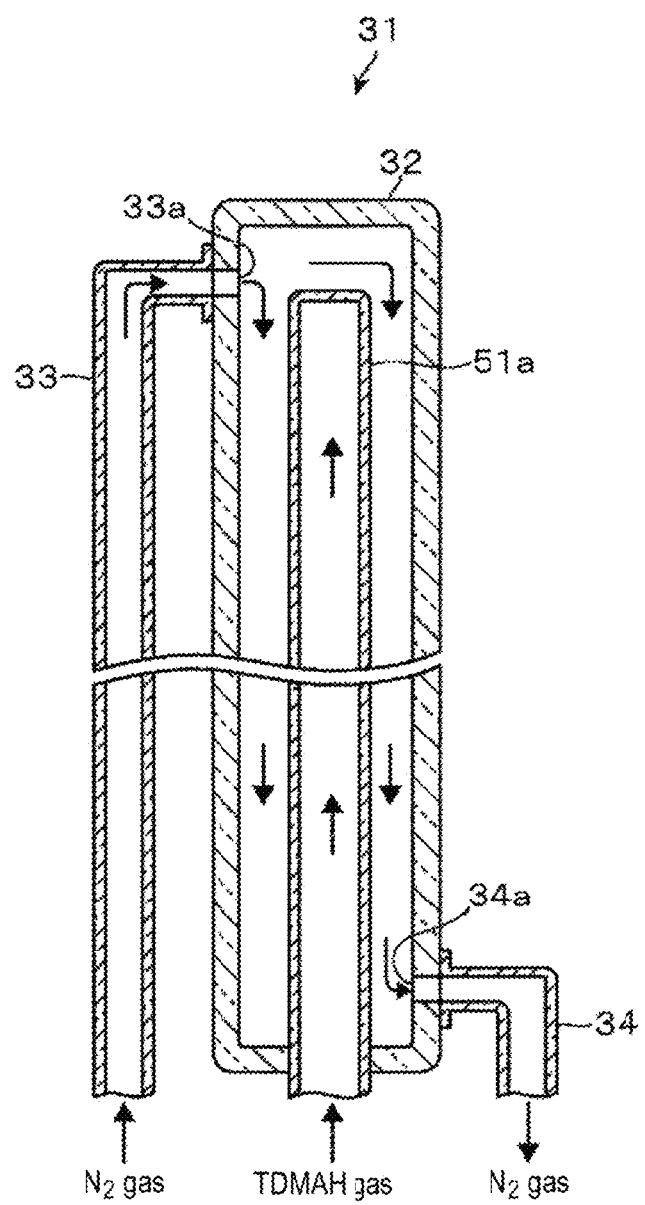
FIG. 6 is a longitudinal sectional view showing the gas nozzle of FIG. 5.

As shown in FIG. 6, the flow path main body 32 has an inner region defining a hollow fluid flowing space for a temperature adjusting fluid. The flow path main body 32 is also air-tightly welded to the source gas nozzle 51a, with a great part of the source gas nozzle 51a embedded in the inner region. Specifically, a slit-shaped opening having a diameter smaller than an external length of the source gas nozzle 51a as viewed from top is formed to extend from a position just below the upper end of the flow path main body 32 to a position of the lower end of the flow path main body 32 at the lateral surface of the flow path main body 32 adjacent to the wafer boat 11. In addition, an opening having the approximately same shape as the source gas nozzle 51a as viewed from top is formed at the bottom surface of the flow path main body 32. The opening of the lateral surface and the opening of the bottom surface are in communication with each other. Therefore, if the source gas nozzle 51a is air-tightly inserted into the flow path main body 32 from below, the gas discharge holes 52 protrude from the flow path main body 32, and a bent of the source gas nozzle 51a facing the flange part 18 is positioned below the flow path main body 32. In this way, the source gas nozzle 51a and the flow path main body 32 are welded to each other in the configuration as shown in FIG. 5. In addition, FIG. 6 shows a cross section along a line A-A of FIG. 5.

The supply path 33 and the exhaust path 34 are formed on the left and right lateral surfaces of the flow path main body 32 as viewed from the wafer boat 11, respectively. The portions in which the supply path 33 and the exhaust path 34 are installed at the flow path main body 32 form a supply hole 33a and an exhaust hole 34a, respectively. The ends of the supply path 33 and the exhaust path 34 opposite to the flow path main body 32 air-tightly penetrate through the flange part 18 in the same manner as the source gas nozzle 51a or the other gas nozzles 51b and 51c, as shown in FIG. 3. That is, each of the ends of the supply path 33 and the exhaust path 34 extends from the flow path main body 32 in the horizontal direction, is bent downward at the right angle, and is connected through the flange part 18 to a temperature adjustment mechanism 35 such as a chiller disposed outside the reaction tube 12. The temperature adjusting fluid is adjusted to have a certain temperature, for example 95 degrees C. by cooling and heating mechanisms provided in the temperature adjustment mechanism 35. The temperature adjusting fluid, i.e., the nitrogen gas in this example, is allowed to circulate inside the flow path main body 32.

The vertical heat treatment apparatus includes the control unit 100 such as a computer in order to perform the operation control of the entire apparatus. A program for performing a film forming process is stored in a memory of the control unit 100. The program is installed in the control unit 100 from a memory unit 101 that is a storage medium such as a hard disc, a compact disc, an magneto-optical disc, a memory card, or a flexible disc.

In operation, when a film forming process is performed on the wafers W, keeping a constant temperature (cooling) of the source gas nozzle 51a is promoted, after the wafer boat 11 is air-tightly loaded in the reaction tube 12. The performance of the cooling of the source gas nozzle 51a will be first described. As previously described above, in the vertical heat treatment apparatus, the respective wafers W are mounted on the wafer boat 11 below the reaction tube 12 and air-tightly accommodated in the reaction tube 12. Then, the wafers W are subjected to a heat treatment. If the heat treatment is terminated, the wafer boat 11 is lowered again and the processed wafers W are replaced with unprocessed wafers W. In this way, the film forming process is continuously performed on a plurality of wafers W in sequence. Therefore, in order to possibly reduce any time loss due to the rise and fall of the internal temperature of the reaction tube 12, after the heat treatment is terminated (when the wafers W are replaced in the wafer boat 11), the output of the heaters 13a to 13e is maintained such that the interior of the reaction tube 12 is maintained at the process temperature for the heat treatment performed on the wafers W.

Here, if the wafer boat 11 is loaded into the reaction tube 12 in a state where the heaters 13a to 13e are set to the uniform setting temperature, the temperature of the wafers W in the region of the lower end side of the wafer boat 11 becomes lower than that of the upper end side thereof. That is, while the wafer boat 11 is moved up, a furnace opening (lower opening) of the reaction tube 12 is opened to the loading/unloading region 2 of a room temperature atmosphere, and thus, heat of the loading/unloading region 2 is dissipated. In addition, when the loading of the wafer boat 11 into the reaction tube 12 is completed, (in other words the plurality of wafers W mounted on the wafer boat 11) wafers W on an upper end side of the wafer boat 11 are already heated to some degree while moving vertically in the reaction tube 12. In the meantime, compared to the wafers W on the upper end side, wafers W on the lower end side of the wafer boat 11 do not move within the reaction tube 12 for a long time period. Thus, the wafers W on the lower end side have a temperature lower than the wafers W on the upper end side. In addition, as already described, an elevating speed of the wafer boat 11 by the boat elevator 3 is extremely low, for example, as compared with a transfer speed of a wafer W by the arm 4. Therefore, when the loading of the wafer boat 11 is terminated, even though the heaters 13a to 13e were set to the uniform setting temperature, there are vertical deviations between the heated temperatures of the wafers W at the wafer boat 11. Then, after the loading of the wafer boat 11 is completed, it becomes necessary to have a waiting time until such temperature deviations are removed (the wafers W have a uniform heated temperature). Thus, the wait time results in a deterioration of throughput.

Therefore, in the vertical heat treatment apparatus, after the loading of the wafer boat 11 is completed, the temperatures of the wafers W are rapidly uniformized Specifically, the setting temperature of the two lower heaters 13d and 13e among the heaters 13a to 13e is set higher than the setting temperature of the other heaters 13a to 13c by, for example, 25 degrees C. or so. Thereafter, the setting temperature of the heaters 13d and 13e is made equal to that of the other heaters 13a to 13c, so that the heated temperature of the wafers W on the lower end side does not become too high.

However, if such temperature control is performed, the heating temperatures of the wafers W can be rapidly uniformized in the vertical direction, but the source gas nozzle 51a would need to be more frequently replaced. That is, in order to prevent impurities such as an organic material contained in the source gas from being introduced into the thin film, the heating temperature of each wafer W in the reaction tube 12 is set near or higher than the thermal decomposition temperature of the source gas. For example, the TDMAH gas has a thermal decomposition temperature of 280 degrees C. or so, and the heating temperature in the reaction tube 12 is 280 to 300 degrees C. Therefore, if the setting temperature of the lowermost heaters 13d and 13e is set higher than the setting temperature of the other heaters 13a to 13c, the source gas is easily thermally decomposed within the lowermost zone of the source gas nozzle 51a. In addition, if the source gas is thermally decomposed within the source gas nozzle 51a, accretion could be attached to the inner wall of the source gas nozzle 51a. Thus, the accretion becomes particles when exfoliated, and the source gas nozzle 51a is easily clogged. If the supply of the source gas is initiated after waiting until the temperature in the source gas nozzle 51a is stabilized to a temperature not higher than the thermal decomposition temperature of the source gas, throughput is reduced due to the waiting time.

Therefore, according to the present disclosure, when the temperature control of the respective heaters 13a to 13e is performed, the source gas nozzle 51a is cooled. The specific sequences of the temperature control of the heaters 13a to 13e and the cooling of the source gas nozzle 51a will be described in detail below, along with the film forming process on wafers W with reference to FIG. 7.

It is assumed that unprocessed wafers W (to be processed from here on) are transferred to and mounted on the wafer boat 11 in the loading/unloading region 2. At this time, the setting temperatures of the heaters 13a to 13e are uniformly set to the heat treatment temperature in the reaction tube 12, as shown in FIG. 7A. The source gas nozzle 51a is heated to the same temperature as the inner region of the reaction tube 12 by the respective heaters 13a to 13e, as shown in FIG. 7C. Then, at a time t0, the wafer boat 11 is elevated and the loading of the wafer boat 11 into the reaction tube 12 is initiated, and, at a time t1, the loading of the wafer boat 11 is terminated.

FIGS. 7A to 7D show changes in the setting temperatures of the heaters 13, the atmosphere temperatures in the reaction tube 12, the temperatures of the wafers W, the temperature of the source gas nozzle 51a, and the flow rate of the temperature adjusting fluid before and after the loading of the wafer boat 11 and when the process (film forming process) is performed. For the temperatures of the heaters 13a to 13e, FIGS. 7A to 7D show the temperature of the lowermost heater 13e and the temperature of the uppermost heater 13a as a representative of the heaters 13 positioned above the heaters 13d and 13e. In addition, regarding the atmosphere temperatures in the reaction tube 12, FIGS. 7A to 7D show the temperature of the zones for which the two lower heaters 13d and 13e service (servicing the zones corresponding to the heaters 13d and 13e). Further, FIGS. 7A to 7D show the temperature of the zone for which the uppermost heater 13a services, as a representative of the zones for which the heaters above the heaters 13d and 13e service. Also, regarding the temperatures of the wafers W, the temperature of the wafer W on the lowermost end of the wafer boat 11 and the temperature of the wafer W on the uppermost end of the wafer boat 11 are shown.

Figure 7D:
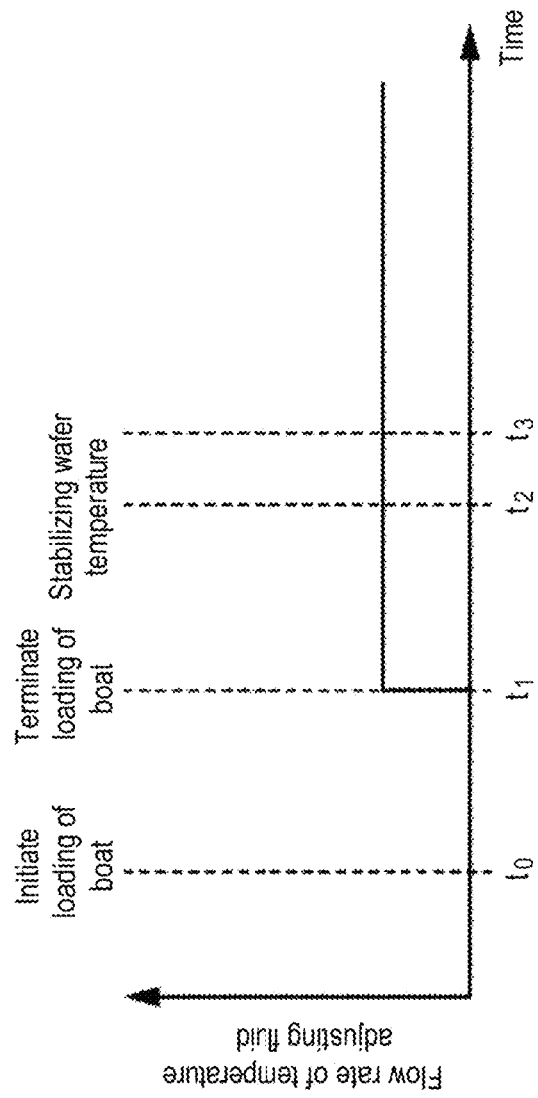

At the time t1 when the loading of the wafer boat 11 is terminated, as shown in FIG. 7A, the setting temperature of the two lower end heaters 13d and 13e is set to a first temperature higher than the setting temperature of the other heaters 13a to 13c, for example, by 25 degrees C. In addition, as shown in FIG. 7D, for example, at the time t1, a nitrogen gas having a setting temperature of, for example, 95 degrees C., is supplied into the flow path main body 32. Thus, the cooling of the source gas nozzle 51a (temperature adjustment) is initiated.

In the reaction tube 12, as shown in FIG. 7B, the temperature of the zones, in which the two lower heaters 13d and 13e services, (the zones corresponding to the heaters 13d and 13e, i.e., the lower region), is raised more rapidly than that of the other zones. In addition, the temperature of the other zones is maintained at the heat treatment temperature of the wafers W. In this regard, as shown in FIG. 7C, the source gas nozzle 51a is maintained, for example, at a temperature below the thermal decomposition temperature of the source gas (cooled), over the length direction of the source gas nozzle 51a, based on a balance between the heating temperature in the reaction tube 12 and the temperature of the nitrogen gas passing through the flow path main body 32.

In addition, as shown in FIG. 7C, the vertical deviation of temperatures occurs between the respective wafers W mounted on the wafer boat 11 at the time t1 when the wafers W are loaded in the reaction tube 12 as already described. However, the wafers W are rapidly heated by the temperature control of the respective zones and reach the heat treatment temperature (time t2). If the heating temperatures of the respective wafers W are uniformized (specifically, after the waiting time until the heating temperatures of the respective wafers W are uniform elapses), as shown in FIG. 7A, the setting temperature of the two lower heaters 13d and 13e will be lowered to a second temperature equal to the setting temperature of the other heaters 13a to 13c (time t2). According to a change of the setting temperature of the heaters 13d and 13e, as shown in FIG. 7B, the temperature in the zones, in which the two lower heaters 13d and 13e serve, is lowered toward the heating temperature of the other zones.

After the heating temperatures of the respective wafers W are uniformized as described above, the thin film forming process is initiated. Specifically, after the reaction tube 12 is vacuumized, the interior of the reaction tube 12 is set to a certain process pressure and the supply of the source gas is initiated (time t3). Here, after making the setting temperature of the two lower heaters 13d and 13e equal to the setting temperature of the other heaters 13a to 13c, the actual temperature of the two lower zones in the reaction tube 12 is gradually lowered, as described above. Therefore, when the supply of the source gas is initiated (time t3), the temperature of the lower zones in the reaction tube 12 exceeds the thermal decomposition temperature of the source gas, or the lower zones have been heated near the thermal decomposition temperature. However, since the source gas nozzle 51a is temperature-adjusted (cooled) by the nitrogen gas, while prevented from being thermally decomposed, the source gas flows and is discharged to the wafers W from the source gas nozzle 51a. The wafers W have thus been heated near the thermal decomposition temperature of the source gas. Therefore, if the source gas is brought into contact with the wafers W, products from the thermal decomposition of the source gas are attached onto surfaces of the respective wafers W.

Subsequently, after the supply of the source gas is stopped, the interior of the reaction tube 12 is vacuumized and an internal atmosphere of the reaction tube 12 is substituted for a purge gas. Then, the reaction gas is supplied to the respective wafers W. The products on the surfaces of the wafers W are oxidized, and reaction products (Hf—O) consisting of hafnium oxide are formed. In this way, the atmosphere in the reaction tube 12 is re-substituted, and the source gas and the reaction gas are alternately supplied to the respective wafers W with the internal atmosphere being substituted, thereby stacking the reaction products to form a thin film.

Figure 8:
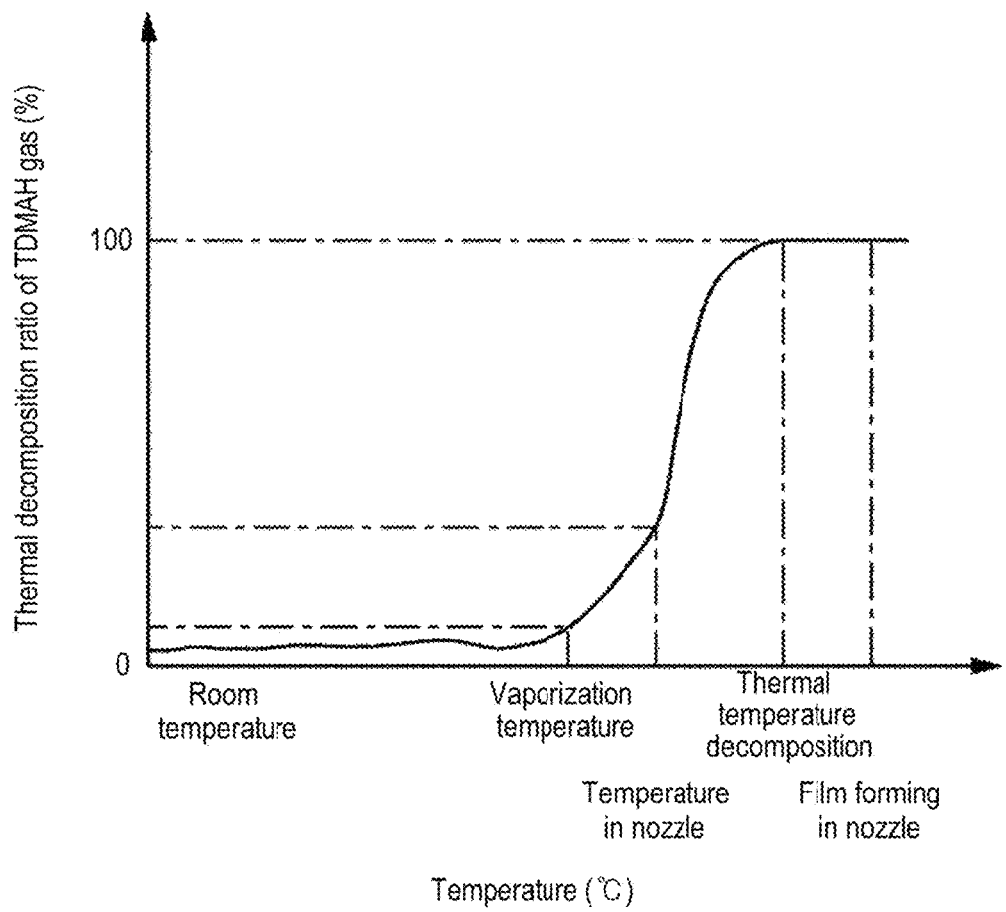
FIG. 8 is a graph showing a temperature of the gas nozzle of FIG. 5.

The temperature-adjusted nitrogen gas is allowed to flow in the flow path main body 32 while the thin film is formed. Thus, the temperature of the source gas is uniformized between the respective wafers W over the film thickness direction in the thin film of each wafer W, thereby making the quality of the thin film uniform. In addition, since the thermal decomposition of the source gas is restrained in the source gas nozzle 51a, the products from the thermal decomposition of the source gas are restrained from being attached and exfoliated. FIG. 8 schematically shows the temperature in the above-described source gas nozzle 51a and the film forming temperature in the reaction tube 12. The internal temperature of the reaction tube 12 is set near or higher than the thermal decomposition temperature of the source gas. Also, the internal temperature of the source gas nozzle 51a is set not less than the vaporization temperature of the source gas and also not higher than the heat treatment temperature.

Thereafter, the setting temperatures of the respective heaters 13a to 13e are maintained at the heat treatment temperature. At the same time, the interior of the reaction tube 12 is returned to the air atmosphere, the wafer boat 11 is lowered, and the processed wafers W are replaced with the unprocessed wafers W, as already described.

According to the above-described embodiment, when the thin film forming process is performed on a plurality of wafers W in the reaction tube 12 in a stack, the flow path forming member 31 is provided in the reaction tube 12 to surround the source gas nozzle 51a. Thus, the temperature adjustment (cooling) of the source gas nozzle 51a is performed. Therefore, as already described, even though the setting temperature of the lower heaters 13d and 13e is set higher than the setting temperature of the other heaters 13a to 13c, the temperature of the source gas can be uniformized over the length direction of the source gas nozzle 51a. Accordingly, even when the setting temperature of the lower heaters 13d and 13e exceeds the thermal decomposition temperature of the source gas, the thermal decomposition (attachment of the products) within the source gas nozzle 51a can be restrained. Therefore, the source gas nozzle 51a needs not to be frequently replaced. In addition, the quality of the thin film may be uniformized between the wafers W. Further, since the temperature adjusting fluid is made not to be infiltrated into the reaction tube 12, the temperature of the source gas nozzle 51a can be made constant without influencing the process performed in the reaction tube 12.

Figure 9:
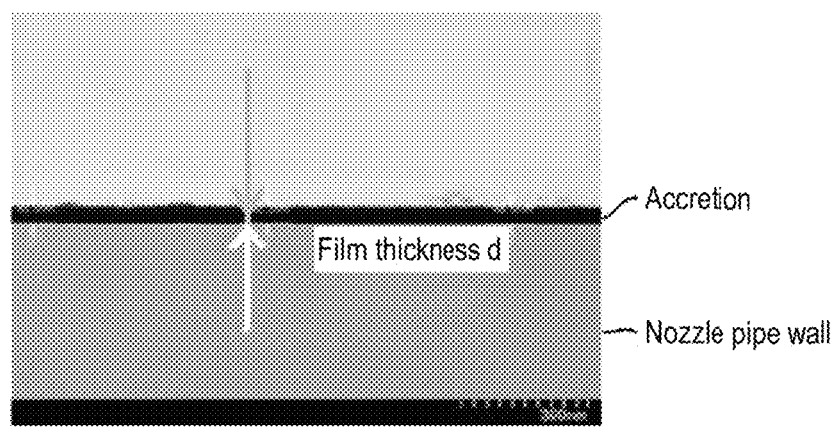
FIG. 9 is a SEM photograph of a cross section of the gas nozzle of FIG. 5.
Figure 10:
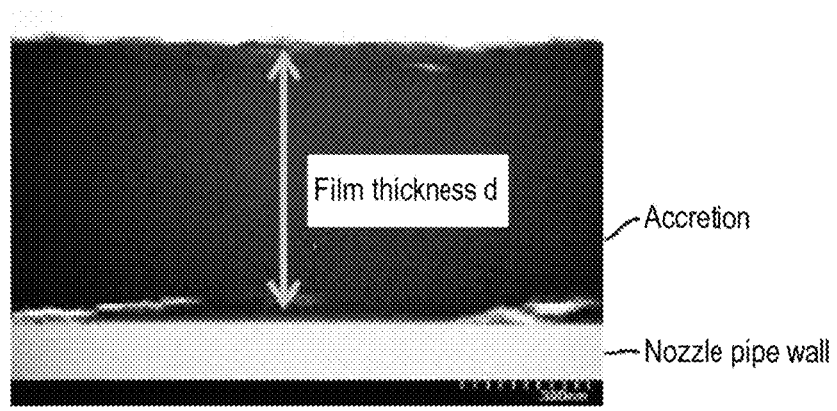
FIG. 10 is a SEM photograph of a cross section of a conventional gas nozzle.

FIG. 9 shows a SEM photograph of the accretion attached to the interior of the source gas nozzle 51a, which has been cut after the above-described source gas nozzle 51a is used in a plurality of film forming processes. FIG. 9 shows that the accretion has a film thickness d of 48.5 nm FIG. 10 shows the accretion attached to the interior of the source gas nozzle 51a when the same film forming processes are performed, without performing the temperature adjustment of the source gas nozzle 51a. FIG. 10 shows that the accretion has a film thickness d of 705 nm, which has become an extremely thick film as compared to the case shown in FIG. 9.

Figure 11:
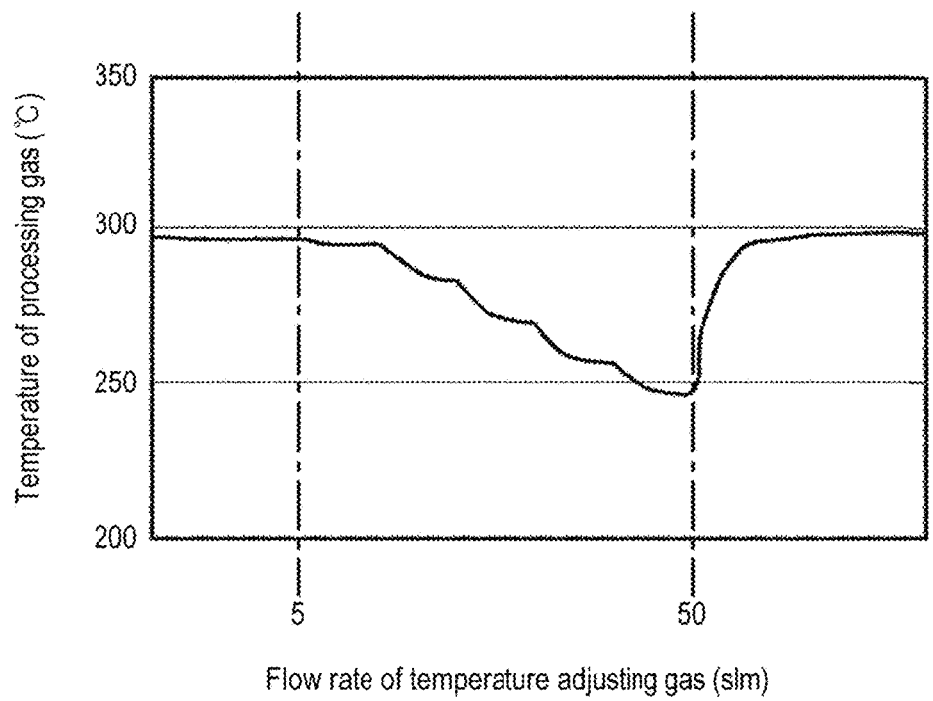
FIG. 11 is a graph showing a correlation between a temperature of the gas nozzle and a flow rate of a temperature adjusting fluid, according to some embodiments.

In addition, FIG. 11 shows a result of an experiment in which the flow rate of the temperature adjusting gas was performed for confirming how the temperature of the source gas discharged into the reaction tube will be changed when the setting temperatures of the respective heaters 13a to 13e are set such that the internal temperature of the reaction tube 12 becomes, for example, 300 degrees C., and the flow rate of the nitrogen gas (temperature: 95 degrees C.) flowing in the flow path main body 32 is variously changed. As seen from FIG. 11, as the flow rate of the temperature adjusting fluid was increased from 5 to 50 slm, the temperature of the source gas was lowered. Accordingly, it can be seen that the temperature of the source gas can be adjusted through the flow rate of the temperature adjusting fluid. Therefore, when the temperature of the processing gas in the source gas nozzle 51a is adjusted, in order to set the temperature of the processing gas to a certain temperature, only at least one of the flow rate of the temperature adjusting fluid and the temperature of the temperature adjusting fluid need be adjusted. Further, in FIG. 11, when the temperature of the source gas was measured, a measuring tip of a temperature measuring unit, such as a thermocouple, was disposed in the vicinity of the gas discharge holes 52 of the source gas nozzle 51a in the lowermost zone, and the temperature of the source gas discharged from the gas discharge holes 52 was measured.

It can be seen from the result of FIG. 11 that even though the heating temperature in the reaction tube 12 exceeds the thermal decomposition temperature of the source gas, the thermal decomposition of the source gas is restrained in the source gas nozzle 51a. In other words, according to the present disclosure, as the source gas nozzle 51a is cooled, the wafers W can be heated up to a high temperature exceeding the thermal decomposition temperature of the source gas. Thus, it is possible to obtain a thin film having an extremely low impurity level.

Figure 12:
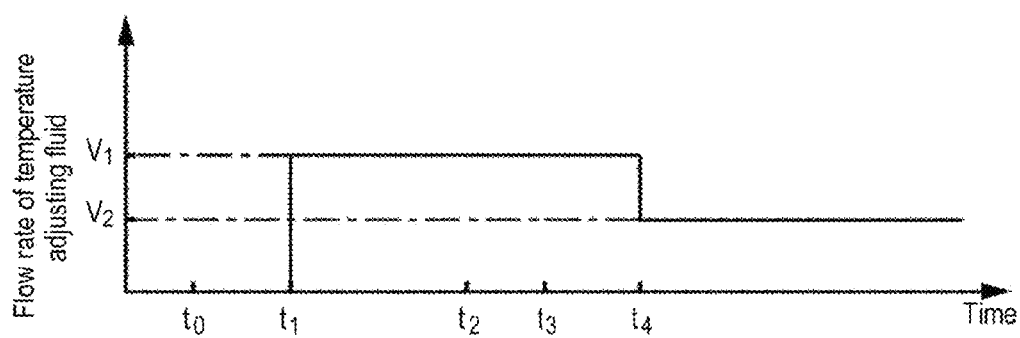
FIGS. 12 and 13 are graphs showing a change over time of a flow rate of the temperature adjusting fluid in another example of the present disclosure.

Hereinafter, other embodiments of the present disclosure will be described. FIG. 12 shows an embodiment in which the supply amount of the temperature adjusting fluid is changed over time. Specifically, when the wafer boat 11 is air-tightly loaded into the reaction tube 12 and the supply of the temperature adjusting fluid is initiated (time t1), the supply amount of the temperature adjusting fluid is set to a flow rate V1. Thereafter, the film forming process is initiated, and then, at a certain timing t4, the supply amount is reduced to a flow rate V2 (V2<V1). That is, as already described in detail, according to the present disclosure, in a so-called preparatory stage until the film forming process is initiated after the wafer boat 11 is loaded into the reaction tube 12, the setting temperature of the lower heaters 13d and 13e is set higher than the setting temperature of the other heaters 13a to 13c. Therefore, the temperature in the source gas nozzle 51a can easily become higher in the preparatory stage rather than after the film forming process is initiated. Accordingly, in this example, the flow rate of the temperature adjusting fluid is set to be larger in the preparatory stage, as compared with after the film forming process is initiated.

Figure 13:
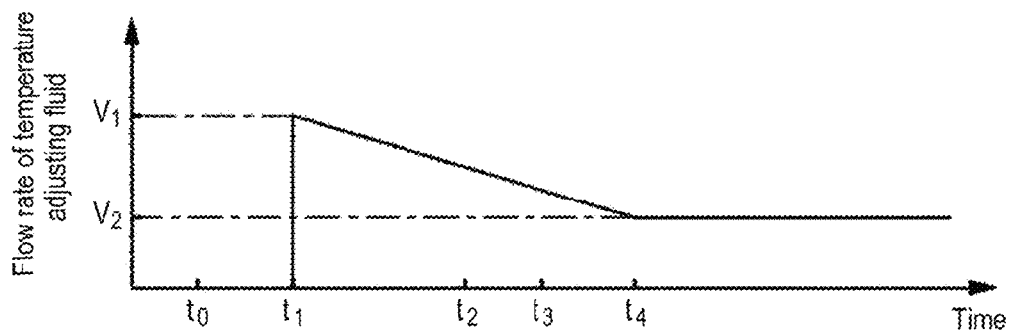
Figure 14:
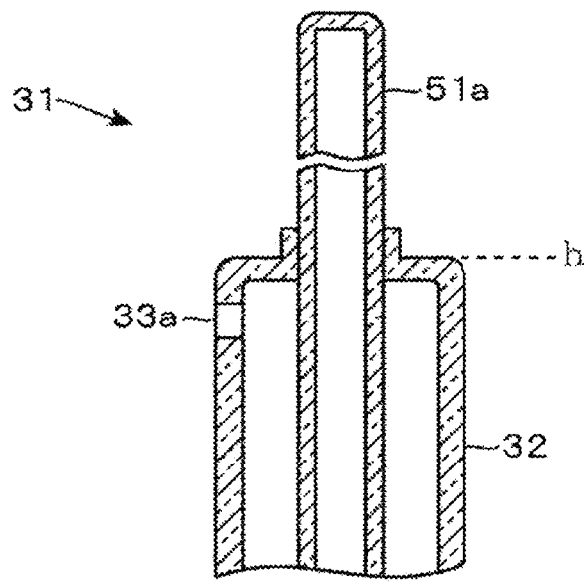
FIG. 14 is a longitudinal sectional view showing a mechanism of adjusting a temperature of the gas nozzle in still another embodiment of the present disclosure.

In addition, FIG. 13 shows an example in which the flow rate of the temperature adjusting fluid is set to be gradually reduced from the flow rate V1 at the time t1 when the supply of the temperature adjusting fluid is initiated to the flow rate V2 at the timing t4. Further, FIG. 14 shows an example in which a flow path forming member 31 is provided from the lower end of the source gas nozzle 51a to a middle portion of the source gas nozzle 51a in the length direction thereof. That is, in order to set the setting temperature of the lower heaters 13d and 13e higher than the setting temperature of the other heaters 13a to 13c in the preparatory stage, the flow path forming member 31 is provided in the zones in which the heaters 13d and 13e serve, or in one upper zone in addition to the aforesaid zones. In FIG. 14, a level h of the upper end of the flow path forming member 31 is set equal to a level of the upper surface of the middle wafer W in the height direction among the plurality of wafers W mounted on the wafer boat 11 in the reaction tube 12. In addition, depiction of the supply path 33 or the exhaust path 34 is omitted in FIG. 14.

In each of the above-described examples, the temperature of the temperature adjusting fluid flowing in the flow path main body 32 is set lower than the heat treatment temperature in the reaction tube 12. However, the temperature of the temperature adjusting fluid may be set near the heat treatment temperature. That is, when a source gas (for example, ozone gas) which is activated near the thermal decomposition temperature is used, the activation of the source gas may be promoted while restraining the thermal decomposition of the source gas in the source gas nozzle 51a.

Further, when setting the heating temperature in a lower portion of the reaction tube 12 to be higher than that in an upper portion thereof, in case of initiating the film forming process, the power of the two lower heaters 13d and 13e from among the heaters 13a to 13e is set larger in the previously-described embodiments. However, only the power of the heater 13e at the lowermost end may be set larger.

Figure 15:
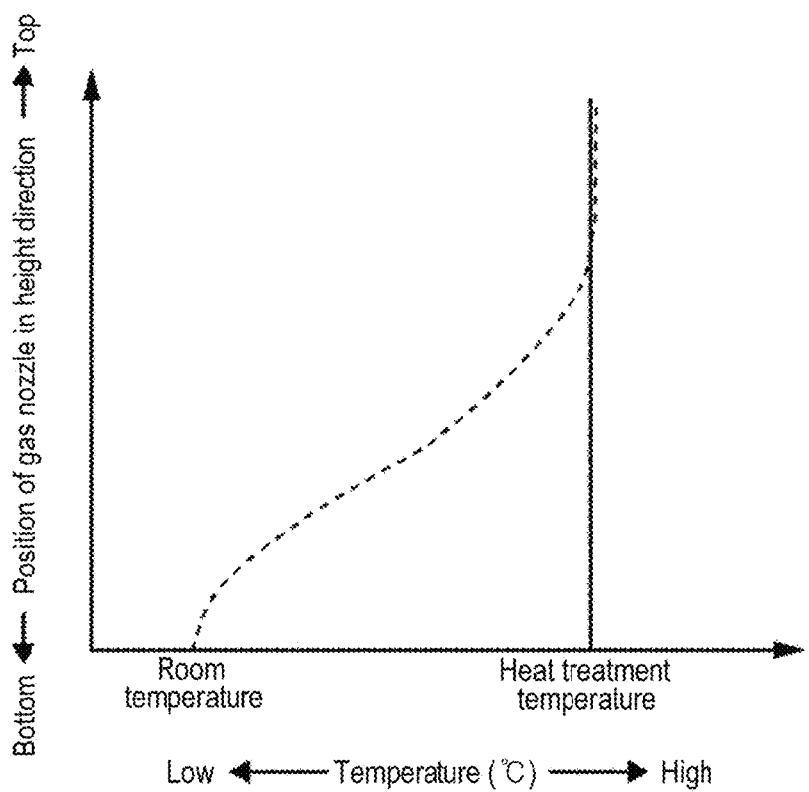
FIG. 15 is a graph showing a temperature distribution of the gas nozzle of FIG. 14.

In addition, when the setting temperatures of the respective heaters 13a to 13e are uniformized from the loading of the wafer boat 11 to the termination of the film forming process, without adjusting the temperature of the lowermost zone, the temperature of the source gas is increased as the source gas flows upward in the source gas nozzle 51a, as shown by a broken line in FIG. 15. Therefore, if such a temperature deviation occurs in the source gas, there is a concern that a degree of the thermal decomposition of the source gas (i.e., the film thickness of the reaction product formed on the wafer W) may be changed in each wafer W. Therefore, in such a case, the temperature adjusting fluid supplied into the flow path main body 32 may be heated at or near the heat treatment temperature of the wafers W, and the temperature of the source gas may be uniformized.

In addition, the flow path forming member 31 is provided with the ozone gas nozzle 51b instead of or along with the source gas nozzle 51a. That is, the temperature of the ozone gas is also increased as the ozone gas flows upward in the ozone gas nozzle 51b. The temperature of the ozone gas is uniformized along the length direction of the ozone gas nozzle 51b, thereby enabling the reactivity of the components of the source gas adsorbed onto the surface of the wafer W and the ozone gas to be uniformized along the vertical direction of the reaction tube 12.

While an ALD method in which a source gas and a reaction gas are alternately supplied to a wafer W has been described as an example, a thin film may be formed by a CVD method in which a source gas and a reaction gas are simultaneously supplied to a wafer W. Further, instead of the configuration that the gas discharge holes 52 are formed in each of the gas nozzles 51a to 51c along the vertical direction of the wafer boat 11, the gas discharge holes 52 may be configured by opening an upper leading end of each of the gas nozzles 51a to 51c.

Regarding the flow path forming member 31, the flow path main body 32 may be formed to cover the periphery of the source gas nozzle 51a (the ozone gas nozzle 51b), i.e., to have a double-tube structure. In such a case, a gas flow path extending from the gas discharge holes 52 of the inner tube toward the outside of the flow path main body 32 may be disposed between the inner tube and the outer tube.

In addition, the temperature adjusting fluid may include liquid (pure water) instead of gas. The source gas used to perform any one of the above-described thin film forming processes may include, for example, Zr (zirconium)-based organic gas, Sr (strontium)-based organic gas, Al (aluminum)-based organic gas, Ti (titanium)-based organic gas, Si (silicon)-based organic gas, and the like, in addition to the Hf-based organic gas. The reaction gas reacting with the organic gas may include water vapor ($H_2O$ gas), in addition to the previously-described ozone gas. Further, for the heat treatment performed on wafers W, instead of using the film forming processes described above, it may be possible to use a process of supplying water vapor to heated wafers W. Even in this heat treatment, the temperature of the water vapor should be constant along the length direction of the gas nozzle, and the constant temperature water vapor should be supplied to each wafer W.

According to the present disclosure, a heat treatment is performed on substrates supported in the configuration of a shelf in a vertical reaction tube. Since a flow path forming member is provided along a gas nozzle that discharges a processing gas to the respective substrates and a temperature adjusting fluid is supplied into the flow path forming member, a temperature of the processing gas can be uniformized along the length direction of the gas nozzle.

While certain embodiments have been described, these embodiments have been presented by way of example only, and are not intended to limit the scope of the present disclosure. Indeed, the embodiments described herein may be embodied in a variety of other forms. Furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A heat treatment method, in which a substrate supporter supporting a plurality of substrates in the configuration of a shelf thereon is loaded in a vertical reaction tube surrounded by a heating mechanism and a heat treatment is performed, comprising:
   discharging a processing gas from a gas nozzle provided in the reaction tube to extend in a vertical direction of the substrate supporter; and
   supplying a temperature adjusting fluid into a flow path forming member provided to surround the gas nozzle in the reaction tube and adjusting a temperature of the processing gas in the gas nozzle.

2. The heat treatment method of claim 1, wherein the temperature adjusting fluid is a temperature adjusting gas.

3. The heat treatment method of claim 1, wherein the processing gas is a source gas for forming a film.

4. The heat treatment method of claim 3, further comprising supplying a reaction gas reacting with the source gas into the reaction tube.

5. The heat treatment method of claim 3, wherein the temperature adjusting fluid is a cooling fluid for cooling the processing gas.

6. The heat treatment method of claim 5, wherein the heating mechanism is configured to include a plurality of heating units to respectively heat a plurality of regions arranged in the reaction tube in a vertical direction,
   the heat treatment method further comprising:
   loading the substrate supporter in the reaction tube; and
   adjusting a heating temperature in the reaction tube such that after the loading of the substrate supporter is terminated, a temperature of a lower region of the reaction tube among the plurality of regions is set to a first temperature higher than a temperature of an upper region relative to the lower region and not less than a thermal decomposition temperature of the processing gas,
   wherein adjusting the temperature of the processing gas includes adjusting at least one of the temperature and the flow rate of the temperature adjusting fluid such that the temperature of the processing gas in the gas nozzle is lowered below the thermal decomposition temperature of the processing gas by the flow of the temperature adjusting fluid.

7. The heat treatment method of claim 6, further comprising lowering the temperature of the lower region of the reaction tube to a second temperature lower than the first temperature after the temperature of the lower region of the reaction tube is set to the first temperature,
   wherein discharging the processing gas includes initiating the supply of the processing gas before the temperature of the lower region of the reaction tube is lowered to the second temperature, after the temperature of the lower region of the reaction tube is set to the first temperature.

8. The heat treatment method of claim 5, wherein when the heat treatment is performed on the substrates, an atmosphere in the reaction tube is set to a temperature not less than the thermal decomposition temperature of the processing gas,
   wherein adjusting the temperature of the processing gas includes maintaining an interior of the gas nozzle at a temperature not higher than the thermal decomposition temperature of the processing gas.

9. The heat treatment method of claim 5, after discharging the processing gas, further comprising reducing a supply flow rate of the temperature adjusting fluid.

10. The heat treatment method of claim 3, wherein the processing gas is a metal-containing organic gas.

11. A non-transitory storage medium configured to store a computer program operating on a computer,
   wherein the computer program includes a group of steps for performing the heat treatment method according to claim 1.

* * * * *